US010961623B2

(12) United States Patent
Koakutsu

(10) Patent No.: US 10,961,623 B2
(45) Date of Patent: Mar. 30, 2021

(54) FILM FORMING METHOD

(71) Applicant: Tokyo Electron Limited, Tokyo (JP)

(72) Inventor: Masato Koakutsu, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 134 days.

(21) Appl. No.: 16/216,181

(22) Filed: Dec. 11, 2018

(65) Prior Publication Data

US 2019/0194807 A1 Jun. 27, 2019

(30) Foreign Application Priority Data

Dec. 21, 2017 (JP) .............................. JP2017-245236

(51) Int. Cl.
*C23C 16/458* (2006.01)
*C23C 16/455* (2006.01)
(Continued)

(52) U.S. Cl.
CPC .... *C23C 16/45527* (2013.01); *C23C 16/4584* (2013.01); *C23C 16/4586* (2013.01); *C23C 16/45544* (2013.01); *C23C 16/45563* (2013.01); *C23C 16/52* (2013.01); *H01L 21/0228* (2013.01); *H01L 21/02164* (2013.01); *H01L 21/02219* (2013.01); *H01L 21/02271* (2013.01); *H01L 21/67248* (2013.01);
(Continued)

(58) Field of Classification Search
CPC ........ C23C 16/45544; C23C 16/45563; C23C 16/4584; C23C 16/4586; C23C 16/52
See application file for complete search history.

(56) References Cited

U.S. PATENT DOCUMENTS 5,385,594 A * 1/1995 Kanamori ............... C03B 19/14
427/162
2007/0122752 A1* 5/2007 Asako ................. H01L 21/3105
430/313
(Continued)

FOREIGN PATENT DOCUMENTS

JP 2014-123675 7/2014

OTHER PUBLICATIONS

Villar-Rodil, S., et al., "Fibrous Carbon Molecular Sieves by Chemical Vapor Deposition of Benzene. Gas Separation Ability". Chem. Mater. 2002, 14, 4328-4333.*
(Continued)

*Primary Examiner* — Bret P Chen
(74) *Attorney, Agent, or Firm* — IPUSA, PLLC

(57) ABSTRACT

A film forming method forms a film including a predetermined element on substrates placed on a turntable, by supplying a first reaction gas including the predetermined element from a first supply part and supplying a second reaction gas from a second supply part in a raised state of the turntable, and rotating the turntable a predetermined number of times in a state in which the separation gas is supplied from a separation gas supply part, and performs an anneal process at least before or after the film forming process, by supplying the separation gas or the second reaction gas from the first supply part and supplying the separation gas or the second reaction gas from the second supply part in a lowered state of the turntable, and rotating the turntable at least once in a state in which the separation gas is supplied from the separation gas supply part.

18 Claims, 9 Drawing Sheets

(51) Int. Cl.
   *H01L 21/687*   (2006.01)
   *H01L 21/67*    (2006.01)
   *H01L 21/02*    (2006.01)
   *C23C 16/52*    (2006.01)

(52) U.S. Cl.
   CPC .. *H01L 21/67276* (2013.01); *H01L 21/68764* (2013.01); *H01L 21/68771* (2013.01)

(56) References Cited

U.S. PATENT DOCUMENTS

| | | | | |
|---|---|---|---|---|
| 2009/0324828 | A1* | 12/2009 | Kato | C23C 16/402 427/255.28 |
| 2011/0236598 | A1* | 9/2011 | Kumagai | C23C 16/45551 427/569 |
| 2012/0094011 | A1* | 4/2012 | Hishiya | C23C 16/45548 427/8 |
| 2012/0264039 | A1* | 10/2012 | Ito | G03F 7/40 430/7 |
| 2013/0019801 | A1* | 1/2013 | Honma | C23C 16/4412 118/719 |
| 2013/0059415 | A1* | 3/2013 | Kato | H01J 37/32733 438/106 |
| 2013/0061804 | A1* | 3/2013 | Enomoto | C23C 16/455 118/719 |
| 2014/0024200 | A1* | 1/2014 | Kato | C23C 16/45551 438/473 |
| 2015/0011087 | A1* | 1/2015 | Oshimo | C23C 16/34 438/680 |
| 2016/0222509 | A1* | 8/2016 | Honma | H01L 21/68792 |
| 2017/0287677 | A1* | 10/2017 | Kato | H01J 37/32366 |
| 2018/0274094 | A1* | 9/2018 | Ikeda | H01L 21/68771 |
| 2019/0172707 | A1* | 6/2019 | Umehara | H01L 21/68771 |

OTHER PUBLICATIONS

Boscher, Nicolas D., et al., "Chemical vapour deposition of metalloporphyrins: a simple route towards the preparation of gas separation membranes". J. Mater. Chem. A, 2016, 4, 18144-18152.*

* cited by examiner

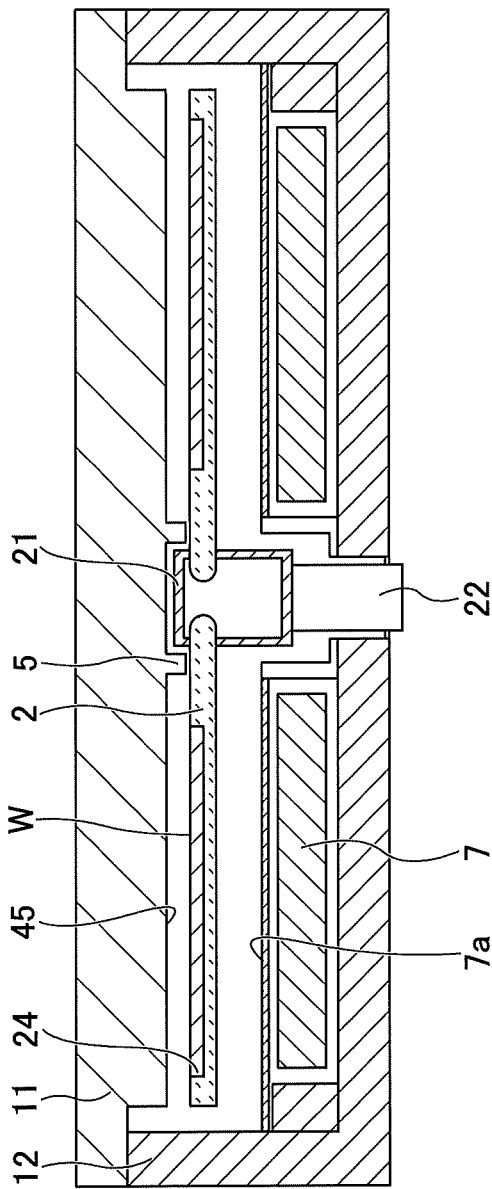
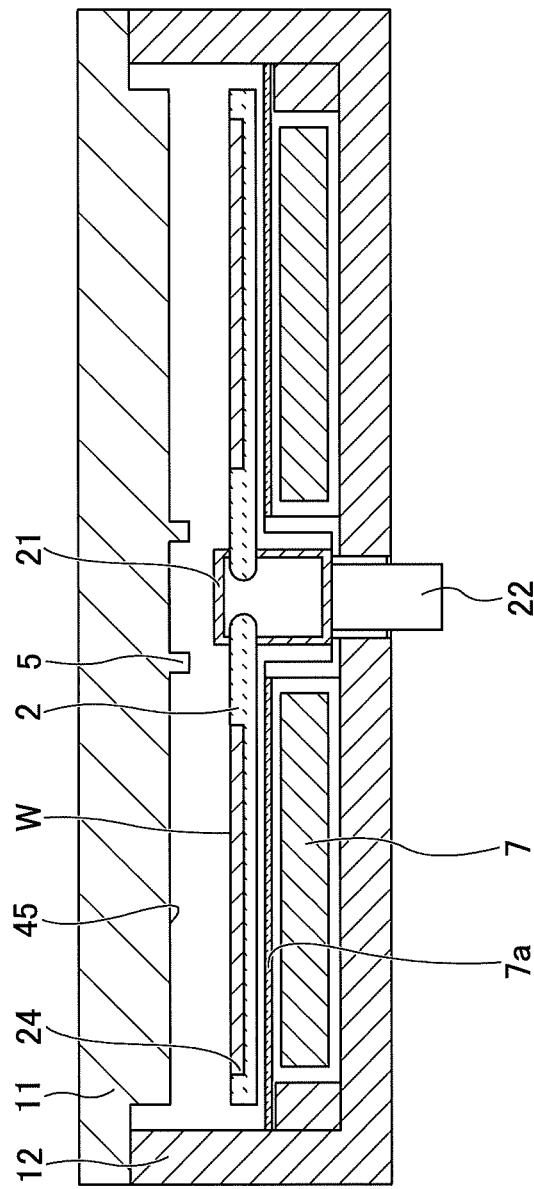
FIG.6A
FIG.6B

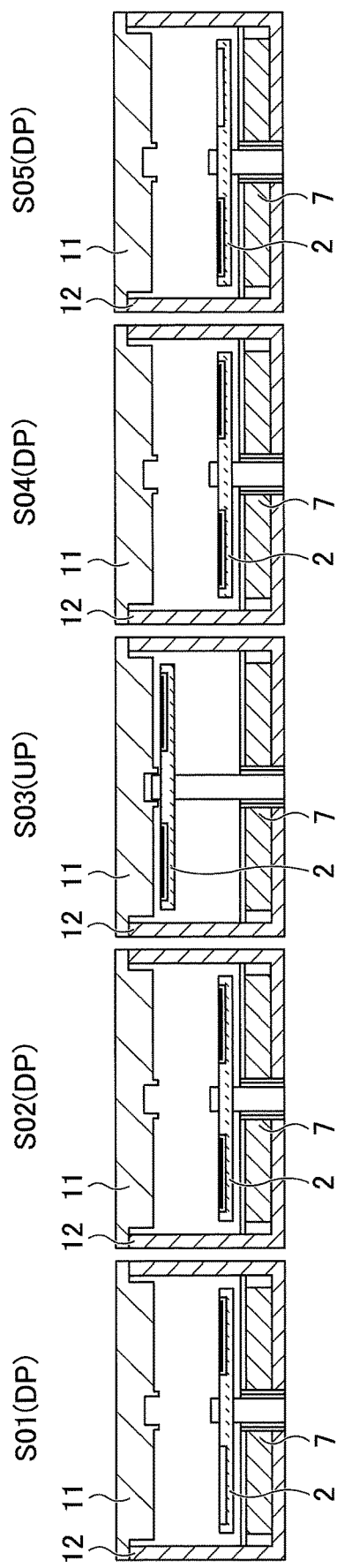

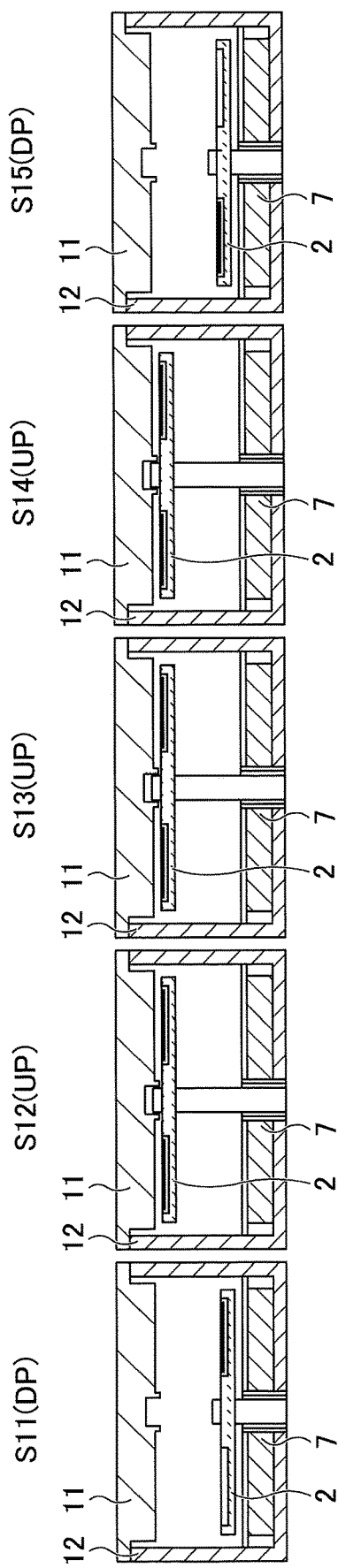

FILM FORMING METHOD

CROSS-REFERENCE TO RELATED APPLICATIONS

This application is based upon and claims priority to Japanese Patent Application No. 2017-245236 filed on Dec. 21, 2017, the entire contents of which are incorporated herein by reference.

BACKGROUND OF THE INVENTION

1. Field of the Invention

The present invention relates to a film forming method, or a deposition method.

2. Description of the Related Art

A process for manufacturing a semiconductor IC (Integrated Circuit) includes a film forming process that forms a film on a semiconductor substrate (hereinafter also referred to as a "substrate" or a "wafer"). From a viewpoint of further reducing the size of the IC by increasing the integration density, there are demands to improve the in-plane uniformity of the wafer in this film forming process. Film forming methods called ALD (Atomic Layer Deposition) and MLD (Molecular Layer Deposition) are expected to satisfy such demands. The ALD uses 2 kinds of reaction gases, namely, a reaction gas A and a reaction gas B, that react with each other. A thin film of a reaction product is formed on the wafer surface by repeating a cycle in which the reaction gas A is adsorbed on the wafer surface and the adsorbed reaction gas A is caused to react with the other reaction gas B. Because the ALD utilizes the adsorption of the reaction gas onto the wafer surface, the ALD can obtain a uniform film thickness can achieve a satisfactory control of the film thickness.

As a film forming apparatus that performs the ALD, there is the so-called turntable type film forming apparatus, or the turntable type deposition apparatus, as proposed in Japanese Laid-Open Patent Publication No. 2014-123675, for example. This proposed film forming apparatus includes a turntable that is rotatably arranged within a vacuum chamber, and a plurality of wafers are placed on the turntable. Separation regions separate a supply region of the reaction gas A and a supply region of the reaction gas B that are sectioned above the turntable. Exhaust vents are provided in correspondence with the supply regions of the reaction gases A and B, and an exhaust device is connected to the exhaust vents. When the turntable is rotated in this proposed film forming apparatus, the wafers pass the supply region of the reaction gas A, the separation region, the supply region of the reaction gas B, and the separation region. As a result, the reaction gas A is adsorbed on the wafer surface in the supply region of the reaction gas A, and the reaction gas A and the reaction gas B react on the wafer surface in the supply region of the reaction gas B. For this reason, there is no need to switch the reaction gas A and the reaction gas B during formation of the film, and the reaction gas A and the reaction gas B may be supplied continuously. Accordingly, an exhaust and/or purge process becomes unnecessary, and a time required to form the film may be shortened.

In a case in which an oxide film including a predetermined element is formed using the turntable type film forming apparatus proposed in Japanese Laid-Open Patent Publication No. 2014-123675, for example, the oxide film including the predetermined element may be formed by using a reaction gas including the predetermined element (for example, a silicon gas or the like including silicon) is used as the reaction gas A, and an oxidation gas such as ozone gas or the like is used as the reaction gas B. In this case, the gas including the predetermined element (that is, the reaction gas A) is first adsorbed on the wafer surface, and the oxidation gas (that is, the reaction gas B) is supplied in this state, so that the reaction gas A and the reaction gas B react on the wafer surface. As a result, a molecular layer of an oxide film including the predetermined element (for example, a silicon oxide film) is formed on the wafer surface. In other words, the oxide film including the predetermined element is formed on the wafer surface by first adsorbing the reaction gas including the predetermined element on the wafer surface, and then causing the reaction gas including the predetermined element to react with the oxidation gas on the wafer surface.

In addition, in a case in which the reaction gas including the predetermined element (for example, a silicon gas or the like including silicon) is used as the reaction gas A, and a nitridization gas including ammonia or the like is used as the reaction gas B, it is possible to form a nitride film including the predetermined element (for example, a silicon nitride film).

In the case in which the turntable type film forming apparatus described above is used to form the oxide film including the predetermined element on a plurality of wafer surfaces by the film forming method described above, the plurality of wafers are arranged on the turntable along a circumferential direction of the turntable. For this reason, when the film forming process is started by simultaneously supplying the reaction gas A including the predetermined element, such as silicon or the like, and the reaction gas B such as the oxidation gas, the nitridization gas, or the like, the supply of the reaction gas A does not necessarily start first for all of the plurality of wafers arranged along a circumferential direction of the turntable. In other words, the supply of the reaction gas A starts for some of the wafers, while the supply of the reaction gas B starts first for remaining ones of the wafers. Consequently, the film forming process starts after oxidation or nitridization for some wafers, while the film forming process starts directly without being subjected to the oxidation or the nitridization for the remaining wafers. Hence, it is not possible to uniformly form the film on each of the plurality of wafers, and inconsistencies are generated in the film formation among the plurality of wafers.

In order to solve the problem described above and form a uniform oxide film or a nitride film on the wafer surface of all of the plurality of wafers, Japanese Laid-Open Patent Publication No. 2014-123675 proposes adsorbing the reaction gas A on the wafer surface in the supply region of the reaction gas A, and performing a preflow process before performing the process in which the reaction gas A and the reaction gas B react on the wafer surface in the supply region of the reaction gas B. In the preflow process, a separation gas is supplied to the supply region of the reaction gas A and the separation region, for example, the reaction gas B is supplied to the supply region of the reaction gas B, and the turntable is rotated to undergo at least 1 revolution. The purpose of the preflow process may be to perform an anneal process by setting the wafer temperature higher than that during the film forming process. The preflow process is sometimes also referred to as a pre-anneal process.

In addition, a postflow process is performed after the film forming process, for the same purpose as the preflow process. In the postflow process, the separation gas is supplied to the supply region of the reaction gas A and the separation region, for example, the reaction gas B is supplied to the supply region of the reaction gas B, and the turntable is rotated to undergo at least 1 revolution, similarly to the preflow process. The purpose of the postflow process may be to perform an anneal process by setting the wafer temperature higher than that during the film forming process. The postflow process is sometimes also referred to as a post-anneal process.

However, because the pre-anneal process and the post-anneal process described above are performed by setting the wafer temperature higher than that during the film forming process, the pre-anneal process and the post-anneal process are performed using an apparatus that is separate from the film forming apparatus. In other words, the pre-anneal process and the post-anneal process are not in-situ processes. As a result, it takes time to transport the wafers in and out of the apparatuses, to thereby deteriorate the productivity. Alternatively, a heater unit may be provided in the film forming apparatus, and a temperature setting of the heater unit may be changed so that the pre-anneal process and the post-anneal process are performed by setting the wafer temperature higher than that during the film forming process in the same film forming apparatus. In other words, the pre-anneal process and the post-anneal process are in-situ processes. In this latter case, it takes time to raise the wafer temperature to a target temperature by changing the temperature setting of the heater unit, to thereby deteriorate the productivity.

SUMMARY OF THE INVENTION

One object of the embodiments is to provide a film forming method that performs a pre-anneal process and a post-anneal process using the same film forming apparatus that is used to perform a film forming process, to reduce a time it takes for a wafer (or substrate) temperature to reach a target temperature and to improve the productivity.

According to one aspect of the embodiments, a film forming method forms a film including a predetermined element on a plurality of substrates using a film forming apparatus that includes a turntable rotatably provided within a chamber and including an upper surface with a plurality of placing parts on which the plurality of substrates are placed, a heater unit provided under the turntable, a first process region sectioning a region above the upper surface of the turntable and including a first gas supply part configured to supply a gas towards the upper surface of the turntable, a second process region arranged at a position separated from the first process region along a circumferential direction of the turntable, and configured to supply a gas towards the upper surface of the turntable, a separation gas supply part provided between the first process region and the second process region, and configured to supply a separation gas toward the upper surface of the turntable, and a separation region including a ceiling surface that forms spaces with respect to the upper surface of the turntable to guide the separation gas from the separation gas supply part toward the upper surface of the turntable, the film forming method including performing a film forming process to form the film including the predetermined element on the plurality of substrates, by supplying a first reaction gas including the predetermined element from the first gas supply part and supplying a second reaction gas from the second gas supply part in a raised state of the turntable, and rotating the turntable to undergo a predetermined number of revolutions in a state in which the separation gas is supplied from the separation gas supply part; and performing an anneal process at least before or after the film forming process, by supplying the separation gas or the second reaction gas from the first gas supply part and supplying the separation gas or the second reaction gas from the second gas supply part in a lowered state of the turntable, and rotating the turntable to undergo at least 1 revolution in a state in which the separation gas is supplied from the separation gas supply part.

Other objects and further features of the present invention will be apparent from the following description when read in conjunction with the accompanying drawings.

BRIEF DESCRIPTION OF THE DRAWINGS

FIG. 6A and FIG. 6B are cross sectional views generally illustrating the structure within the vacuum chamber of the film forming apparatus illustrated in FIG. 1;

FIG. 7A, FIG. 7B, FIG. 7C, FIG. 7D, and FIG. 7E are cross sectional views of the film forming apparatus for explaining an example of a sequence of the film forming method in one embodiment of the present invention;

FIG. 8A, FIG. 8B, FIG. 8C, FIG. 8D, and FIG. 8E are cross sectional views of the film forming apparatus for explaining a sequence of the film forming method in a comparison example.

DESCRIPTION OF THE PREFERRED EMBODIMENTS

Figure 1:
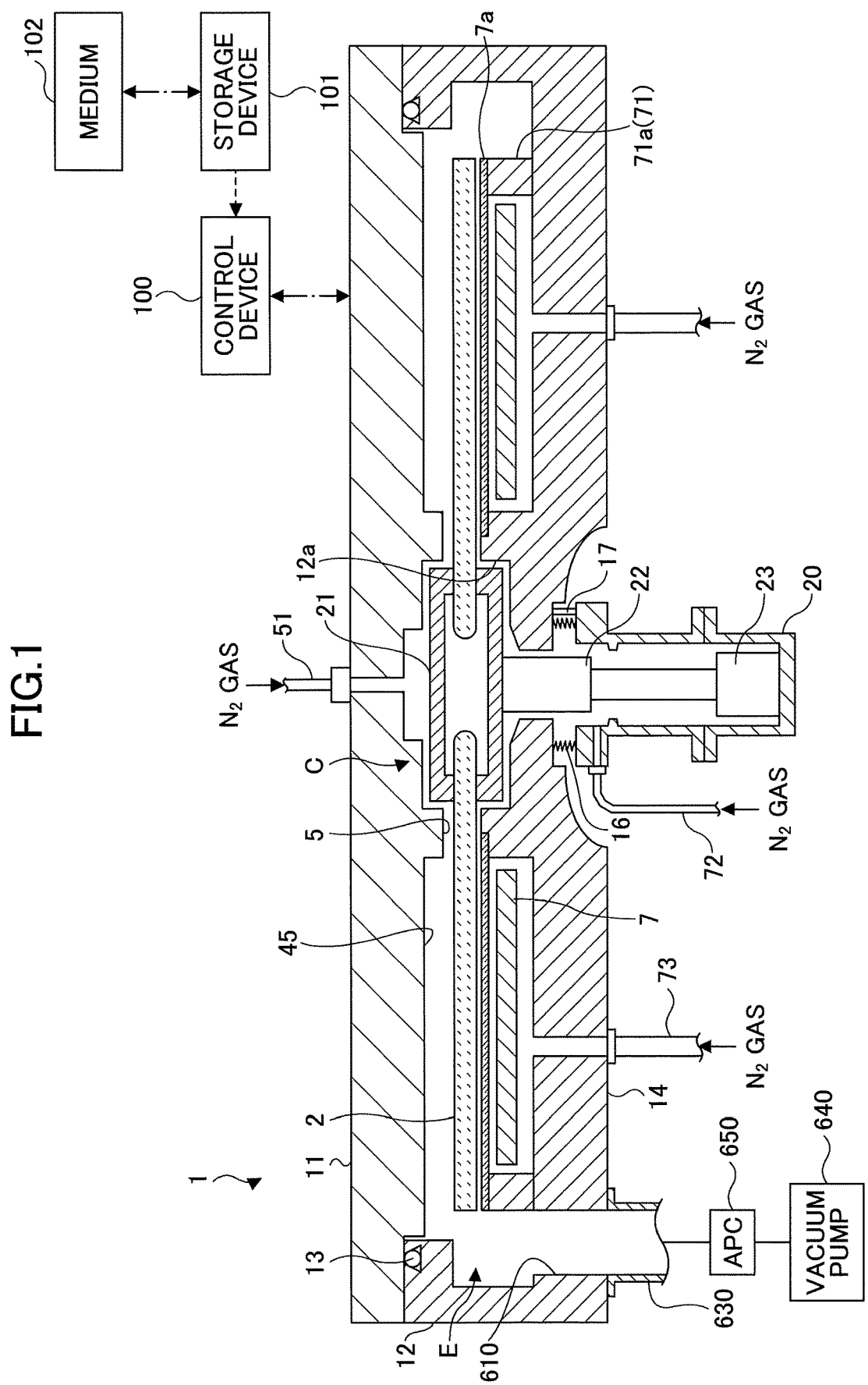
FIG. 1 is a cross sectional view illustrating an example of a film forming apparatus suited for use in carrying out a film forming method in one embodiment of the present invention.

Embodiments of the present invention will be described by referring to the drawings. In the drawings, those corresponding parts or members that are the same are designated by the same reference numerals, and a repeated description thereof will be omitted. In addition, the drawings are not drawn to scale for the purposes of indicating particular relative ratios of the parts or members. Accordingly, particular dimensions of the parts or members may be appropriately determined by those skilled in the art in the non-limiting examples of the embodiments described hereunder.

Embodiment

[Film Forming Apparatus]
First, a film forming apparatus suited for use in carrying out a film forming method in one embodiment of the present invention will be described, by referring to FIG. 1 through FIG. 3.

FIG. 1 is a cross sectional view illustrating an example of the film forming apparatus suited for use in carrying out the film forming method in one embodiment of the present invention. FIG. 2 is a perspective view illustrating a structure within a vacuum chamber of the film forming apparatus illustrated in FIG. 1. In addition, FIG. 3 is a top view generally illustrating the structure within the vacuum chamber of the film forming apparatus illustrated in FIG. 1.

Figure 2:
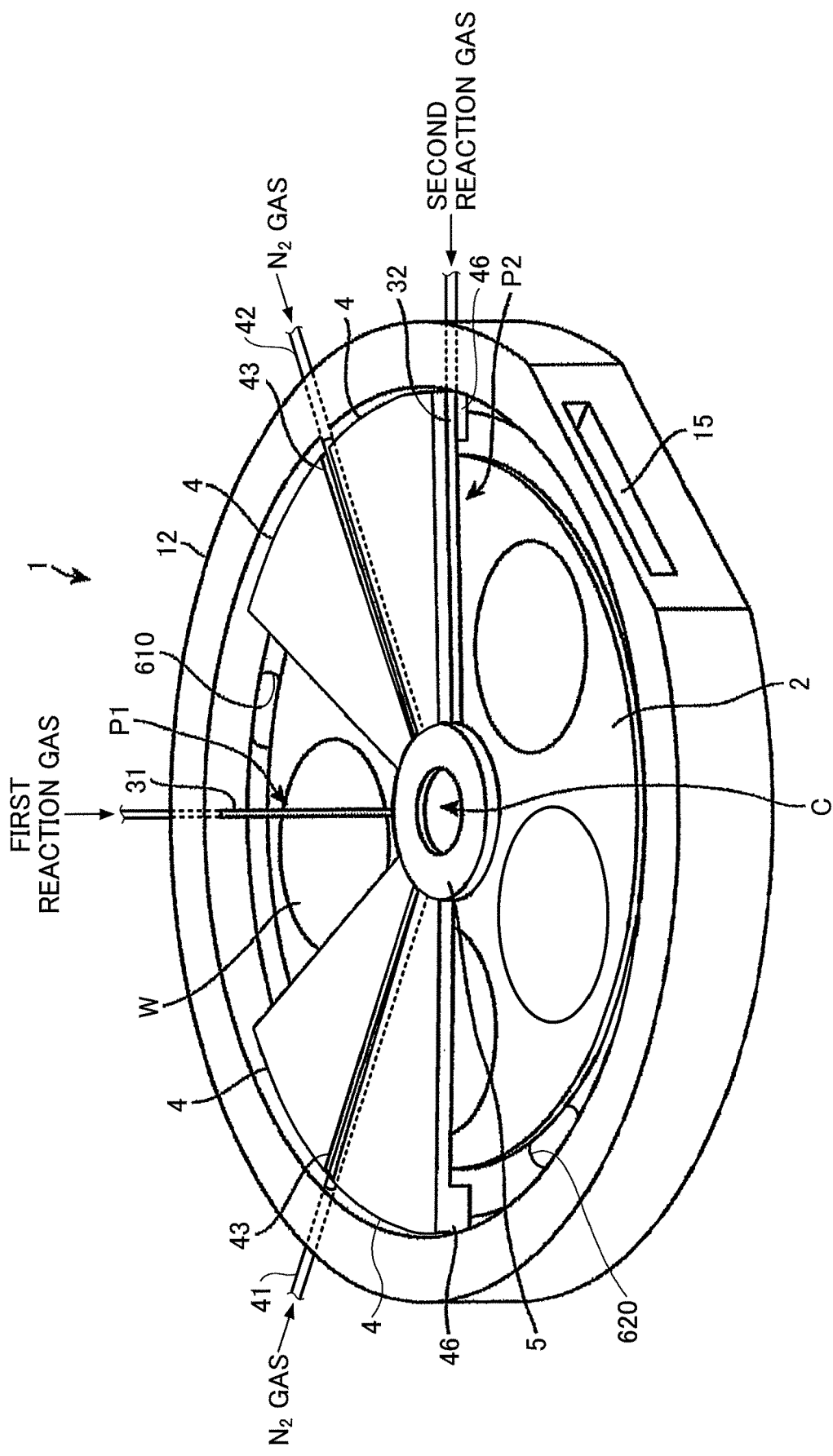
FIG. 2 is a perspective view illustrating a structure within a vacuum chamber of the film forming apparatus illustrated in FIG. 1.
Figure 3:
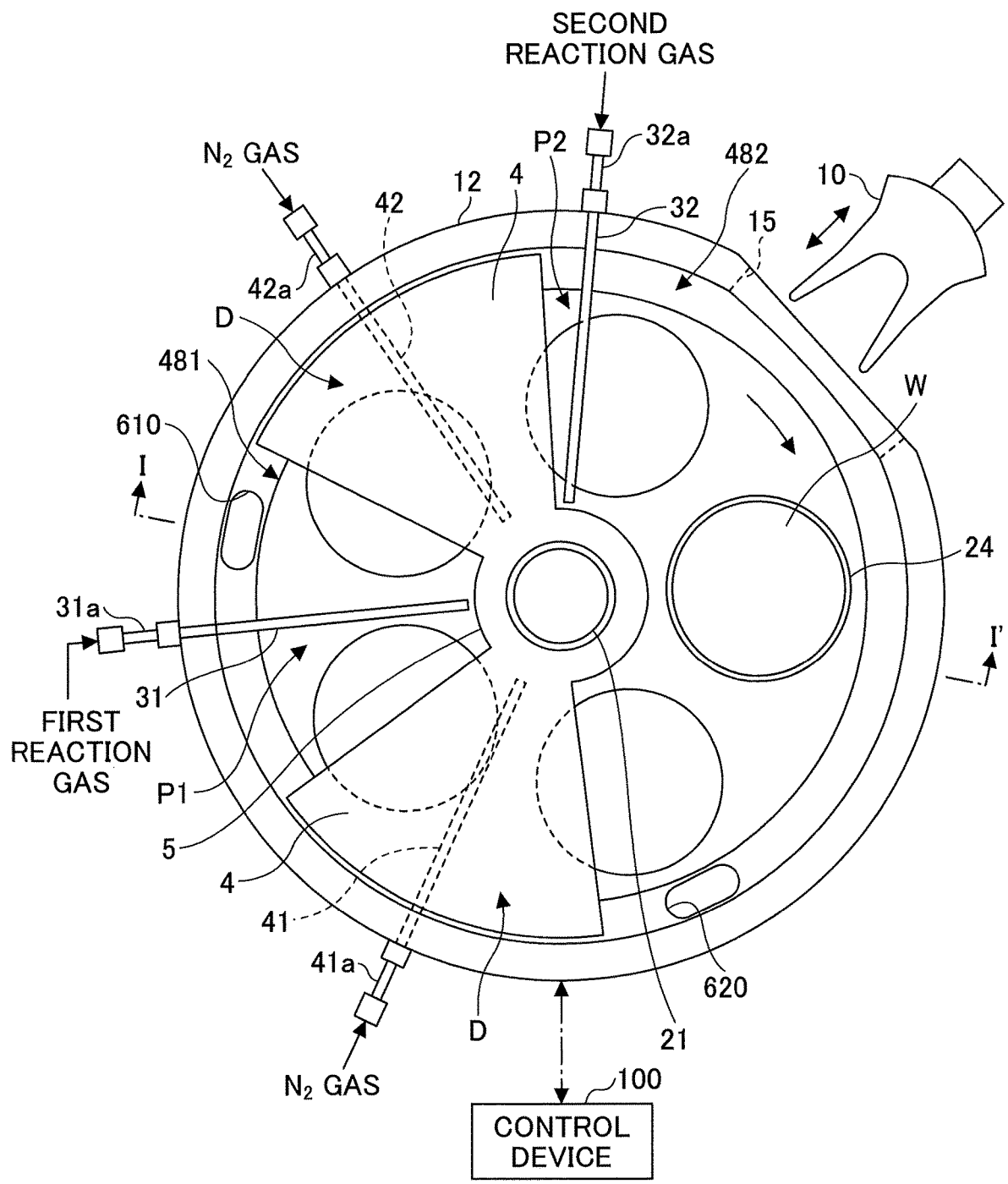
FIG. 3 is a top view generally illustrating the structure within the vacuum chamber of the film forming apparatus illustrated in FIG. 1.

As illustrated in FIG. 1 through FIG. 3, the film forming apparatus in one embodiment includes a flat chamber 1 having a planar shape that is approximately circular, and a turntable 2 provided within the chamber 1. The turntable 2 has a rotation center arranged at a center of the chamber 1. The chamber 1 includes a main enclosure body 12 having a bottomed cylindrical shape, and a top plate 11 that is detachably and airtightly provided on an upper surface of the main enclosure body 12 via a sealing member 13 illustrated in FIG. 1, such as an O-ring, for example.

A central part of the turntable 2 is fixed to a core part 21 having a cylindrical shape, and this core part 21 is fixed to an upper end of a rotational shaft 22 that extends in a vertical direction and is rotatably provided. The rotational shaft 22 penetrates a bottom part 14 of the chamber 1, and a lower end of the rotational shaft 22 is mounted on a driving part that rotates the rotational shaft 22 in FIG. 1 around a vertical axis. The rotational shaft 22 and the driving part 23 are accommodated within a case body 20 that has a cylindrical shape and an upper surface with an opening. The upper surface of the case body 20 is provided with a flange part that is airtightly mounted on a lower surface of the bottom part 14 of the chamber 1. Hence, an internal atmosphere of the case body 20 is isolated from an external atmosphere.

In addition, a first exhaust vent 610 is provided on an outer edge part inside the chamber 1, and the first exhaust vent 610 communicates to an exhaust pipe 630. The exhaust pipe 630 is connected to a vacuum pump 640 via an APC (Automatic Pressure Controller) 650, and the film forming apparatus can exhaust the inside of the chamber 1 through the first exhaust vent 610.

As illustrated in FIG. 2 and FIG. 3, circular cavities 24 are provided in a surface of the turntable 2 along a rotating direction (or circumferential direction) of the turntable 2. A semiconductor substrate (hereinafter also referred to as a "substrate" or a "wafer") W can be placed in each cavity 24. In this example, five cavities 24 are provided, and thus, five wafers W may be placed in the five cavities 24. For the sake of convenience, FIG. 3 illustrates the wafer W in only one of the five cavities 24. Each cavity 24 has an inner diameter slightly larger (for example, 2 mm larger) than a diameter (for example, 300 mm) of the wafer W, and a depth that is approximately the same as a thickness of the wafer W. Each cavity 24 forms a placing part in which the wafer W may be placed. Accordingly, when the wafer W is placed in the cavity 24, a surface of the wafer W and a surface of the turntable 2 (in a region where the wafer W is not placed) become the same height. Through-holes (not illustrated) are formed in a bottom surface of each cavity 24, and for example, 3 pins (not illustrated) for supporting a lower surface of the wafer W and raising and lowering the wafer W penetrate the through-holes.

FIG. 2 and FIG. 3 are diagrams for explaining the structure within the chamber 1, and for the sake of convenience, the illustration of the top plate 11 is omitted. As illustrated in FIG. 2 and FIG. 3, a reaction gas nozzle 31, a reaction gas nozzle 32, a separation gas nozzle 41, and a separation gas nozzle 42, respectively made of quartz, for example, are arranged above the turntable 2. In this example, the separation gas nozzle 41, the reaction gas nozzle 31, the separation gas nozzle 42, and the reaction gas nozzle 32 are arranged clockwise (that is, in the rotating direction of the turntable 2) in this order from a transport port 15 which will be described later, at intervals along a circumferential direction of the chamber 1. Gas inlet ports 31a, 32a, 41a, and 42a illustrated in FIG. 3, forming base end parts of the nozzles 31, 32, 41, and 42, are fixed to an outer peripheral wall of the main enclosure body 12, so that the nozzles 31, 32, 41, and 42 extend from the outer peripheral wall of the chamber 1 to the inside of the chamber 1. The nozzles 31, 32, 41, and 42 extend parallel to the turntable 2, along a radial direction of the main enclosure body 12.

A first reaction gas supply source, that stores a first reaction gas, is connected to the reaction gas nozzle 31 via a shut-off valve (not illustrated) and a flow regulator valve (not illustrated). A second reaction gas supply source, that stores a second reaction gas that reacts with the first reaction gas, is connected to the reaction gas nozzle 32 via a shut-off valve (not illustrated) and a flow regulator value (not illustrated).

The first reaction gas is preferably a gas including a semiconductor element or a metal element. The first reaction gas is selected from gases so that when the first reaction gas becomes an oxide or a nitride, the oxide or the nitride is usable as an oxide film or a nitride film. The second reaction gas is selected from oxidation gases or nitridization gases so that a semiconductor oxide or a semiconductor nitride, or a metal oxide or a metal nitride, can be generated by reacting with the semiconductor element or the metal element. More particularly, the first reaction gas is preferably an organic semiconductor gas including the semiconductor element, or an organic metal gas including the metal element. In addition, the first reaction gas is preferably a gas that is adsorbent with respect to a surface of the wafer W. The second reaction gas is preferably an oxidation gas that exhibits an oxidation reaction or a nitridization gas that exhibits a nitridization reaction, with respect to the first reaction gas adsorbed on the surface of the wafer W, so that a reaction compound can be deposited on the surface of the wafer W.

More particularly, the first reaction gas is a reaction gas including silicon, for example, and is an organic aminosilane gas, such as a diisopropyl aminosilane gas, a bistertial butylamonio silane (BTBAS) gas, or the like, that forms $SiO_2$ as an oxide film or SiN as a nitride film. Alternatively, the first reaction gas is a reaction gas including hafnium, for example, such as tetrakis dimethylamino hafnium (TDMAH) that forms HfO as the oxide film. Or, the first reaction gas is a reaction gas including titanium, for example, such as $TiCl_4$ or the like, that forms TiN as the nitride film. On the other hand, the second reaction gas is an oxidation gas, for example, such as an ozone ($O_3$) gas, an oxygen gas ($O_2$), or the like. Alternatively, the second reaction gas is a nitridization gas, for example, such as an ammonia gas ($NH_3$) or the like.

An inert gas supply source that supplies an inert gas, such as a noble gas such as an Ar gas, a He gas or the like, a nitrogen ($N_2$) gas, or the like, is connected to each of the separation gas nozzles 41 and 42 via a shut-off valve (not illustrated) and a flow regulator value (not illustrated). The inert gas supplied from the separation gas nozzles 41 and 42 may also be referred to as a separation gas. In this embodiment, a $N_2$ gas, for example, is used as the inert gas.

In addition to the first reaction gas supply source, the second reaction gas supply source, and the inert gas supply source that supplies the inert gas, such as the noble gas such as an Ar gas, a He gas or the like, a nitrogen ($N_2$) gas, or the like as the separation gas, are connected to the reaction gas nozzle 31 so that a switching device (not illustrated) may be switched to supply the gas from one of the first reaction gas supply source, the second reaction gas supply source, and the inert gas supply source. In addition to the second reaction gas supply source, the first reaction gas supply source, and the inert gas supply source that supplies the inert gas as the separation gas, are connected to the reaction gas nozzle 32 so that a switching device (not illustrated) may be switched to supply the gas from one of the second reaction gas supply source, the first reaction gas supply source, and the inert gas supply source.

Figure 4:
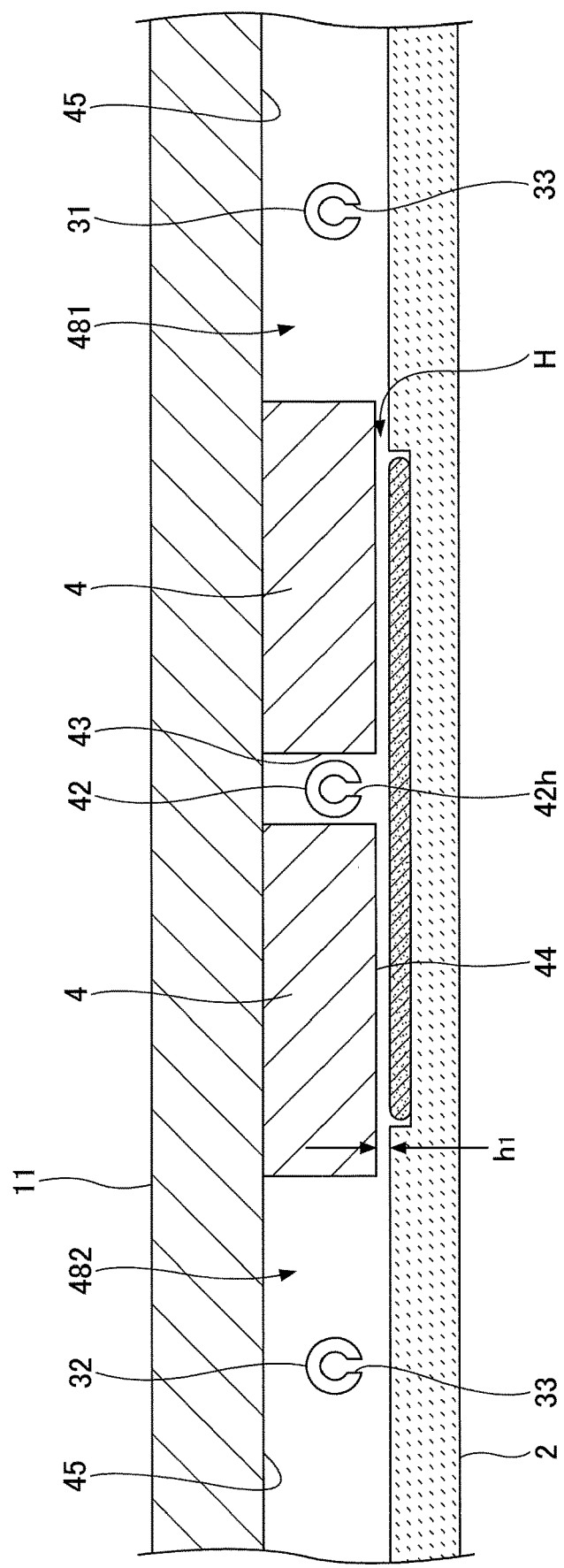
FIG. 4 is a view in partial cross section illustrating the film forming apparatus illustrated in FIG. 1 including reaction gas nozzles and a separation gas nozzle.

FIG. 4 is a view in partial cross section illustrating the film forming apparatus illustrated in FIG. 1 including the reaction gas nozzles 31 and 32, and the separation gas nozzle 42. As illustrated in FIG. 4, a plurality of gas ejection holes 33 that open downward toward the turntable 2 are arranged in each of the reaction gas nozzles 31 and 32 at intervals of 10 mm, for example, along a longitudinal direction of each of the reaction gas nozzles 31 and 32. As illustrated in FIG. 3, a region sectioned under the reaction gas nozzle 31 forms a first process region P1 for adsorbing the first reaction gas on the wafer W. A region sectioned under the reaction gas nozzle 32 forms a second process region P2 for oxidization or nitridization of the first reaction gas that is adsorbed on the wafer W in the first process region P1.

As illustrated in FIG. 2 and FIG. 3, 2 convex parts 4 are provided inside the chamber 1. As will be described later, the 2 convex parts 4 are mounted on a lower surface of the top plate 11 so as to project toward the turntable 2. The convex parts 4 form separation regions D together with the separation gas nozzles 41 and 42, respectively. Regions under the separation gas nozzles 41 and 42 separate the first process region P1 and the second process region P2, and form the separation regions D that prevent mixing of the first reaction gas and the second reaction gas. The convex parts 4 have a planar shape that is an approximate fan-shape such that an apex part is cut into an arcuate shape. In this embodiment, an inner arc connects to a projecting part 5 which will be described later, and an outer arc is arranged along an inner peripheral surface of the main enclosure body 12 of the chamber 1.

FIG. 4 illustrates the cross section of the chamber 1 along a circle that is concentric to the turntable 2, from the reaction gas nozzle 31 to the reaction gas nozzle 32. As illustrated in FIG. 4, the convex parts 4 are mounted on the lower surface of the top plate 11. For this reason, a flat low ceiling surface 44 of the top plate 11, formed by a lower surface of the convex part 4, and a high ceiling surface 45 higher than the low ceiling surface 44 and located on both sides along the circumferential direction of the low ceiling surface 44, exist inside the chamber 1. The low ceiling surface 44 is an example of a first ceiling surface, and the high ceiling surface 45 is an example of a second ceiling surface.

Further, as illustrated in FIG. 4, a groove part 43 is formed at a central part along the circumferential direction of the convex part 4. The groove part 43 extends along a radial direction of the turntable 2. The groove part 43 accommodates the separation gas nozzle 42. A groove part 43 is similarly formed in the other convex part 4, and accommodates the separation gas nozzle 41. FIG. 4 illustrates a gas ejection hole 42h formed in the separation gas nozzle 42. A plurality of gas ejection holes 42h are formed at predetermined intervals (for example, 10 mm) along a longitudinal direction of the separation gas nozzle 42. In addition, a hole diameter of the gas ejection hole 42h is in a range of 0.3 mm to 1.0 mm, for example. A plurality of gas ejection holes similar to the gas ejection holes 42h are formed in the separation gas nozzle 41, although illustration of such gas ejection holes will be omitted.

The reaction gas nozzles 31 and 32 are provided in spaces under the high ceiling surface 45. The reaction gas nozzles 31 and 32 are provided at locations near the wafer W but separated from the high ceiling surface 45. For the sake of convenience, FIG. 4 illustrates an example in which the reaction gas nozzle 31 is provided in a space 481 under the high ceiling surface 45, and the reaction gas nozzle 32 is provided in a space 482 under the high ceiling surface 45.

The low ceiling surface 44 forms a separation space H, that is a narrow space, with respect to the turntable 2. When $N_2$ gas is supplied from the separation gas nozzle 42, this $N_2$ gas flows toward the space 481 and the space 482 through the separation space H. In this state, because a volume of the separation space H is smaller than volumes of the spaces 481 and 482, the $N_2$ gas can make a pressure in the separation space H higher than pressures in the spaces 481 and 482. In other words, the separation space H provides a pressure barrier between the spaces 481 and 482. Further, the $N_2$ gas flowing from the separation space H towards the spaces 481 and 482 acts as a counterflow with respect to the first reaction gas from the first process region P1 and the second reaction gas (the oxidation gas or the nitridization gas) from the second process region P2. Accordingly, the first reaction gas from the first process region P1 and the second reaction gas from the second process region P2 are separated by the separation space H. As a result, it is possible to reduce mixing and reaction of the first reaction gas and the oxidation gas or the nitridization gas inside the chamber 1.

A height h1 of the low ceiling surface 44 with respect to an upper surface of the turntable 2 is preferably set to a height suited for making the pressure in the separation space H higher than the pressures in the spaces 481 and 482, by taking into consideration a pressure inside the chamber 1 during the deposition, a rotational speed of the turntable 2, an amount of the separation gas ($N_2$ gas) that is supplied, or the like.

Returning to the description of FIG. 1 through FIG. 3, the projecting part 5 is provided on the lower surface of the top plate 11, so as to surround an outer periphery of the core part 21 to which the turntable 2 is fixed. In this embodiment, this projecting part 5 is formed to be continuous with a part of each of the convex parts 4 at the rotation center end of the convex parts 4. A lower surface of this projecting part 5 is formed to the same height as the low ceiling surface 44.

Figure 5:
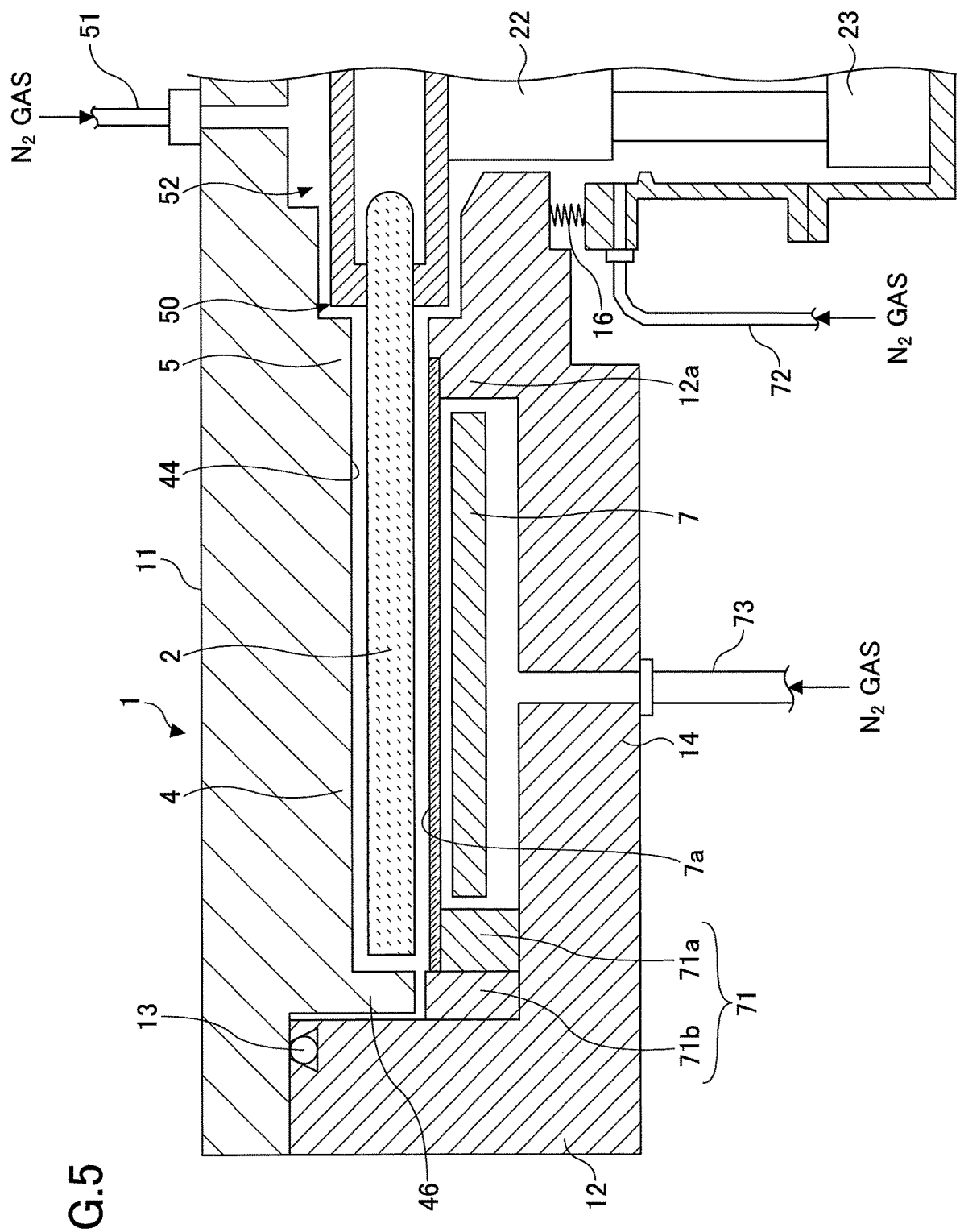
FIG. 5 is another view in partial cross section illustrating the film forming apparatus illustrated in FIG. 1 including a ceiling surface.

FIG. 1 referred above is a cross sectional view along a line I-I' in FIG. 3, and illustrates a region provided with the high ceiling surface 45. On the other hand, FIG. 5 is a view in partial cross section illustrating a region provided with the low ceiling surface 44. As illustrated in FIG. 5, a curved part 46, that curves in an L-shape so as to oppose an outer end surface of the turntable 2, is formed on a peripheral edge part of the approximately fan-shaped convex part 4 (part on an outer edge end of the chamber 1). This curved part 46 reduces communication of the gas between the space 481 and the space 482 through a space between the turntable 2 and the inner peripheral surface of the main enclosure body 12. Because the approximately fan-shaped convex parts 4 are provided on the top plate 11 and the top plate 11 is removable from the main enclosure body 12, a slight gap is formed between an outer peripheral surface of the curved part 46 and the main enclosure body 12. A gap between the inner peripheral surface of the curved part 46 and the outer end surface of the turntable 2, and a gap between the outer peripheral surface of the curved part 46 and the main enclosure body 12, are set to sizes similar to the height h1 of the low ceiling surface 44 with respect to the upper surface of the turntable 2, for example.

Returning again to the description of FIG. 3, the first exhaust vent 610 communicating to the space 481, and the second exhaust vent 620 communicating to the space 482, are provided between the turntable 2 and the inner peripheral surface of the main enclosure body 12. As illustrated in FIG. 1, the first exhaust vent 610 is connected to the vacuum pump 640, which is an example of a vacuum evacuation means, for example, through the exhaust pipe 630. In addition, the APC 650, which is an example of a pressure adjusting means, for example, is provided in the exhaust pipe 630 between the first exhaust vent 610 and the vacuum pump 640. Similarly, the second exhaust vent 620 is connected to a vacuum pump (not illustrated) through an exhaust pipe (not illustrated) in which an APC (not illustrated) is provided. Exhaust gas pressures of the first exhaust vent 610 and the second exhaust vent 620 are independently controllable.

As illustrated in FIG. 1 and FIG. 5, a heater unit 7, which is an example of a heating means, is provided in a space between the turntable 2 and the bottom part 14 of the chamber 1. The heater unit 7 heats the wafer W on the turntable 2, via the turntable 2, to a temperature (for example, 450° C.) determined by a process recipe. A ring-shaped cover member 71 is provided at a lower end near the peripheral edge of the turntable 2, in order to reduce the gas entering the space under the turntable 2. As illustrated in FIG. 5, this cover member 71 includes an inner member 71a that is provided to face the outer edge part and an outer peripheral side of the outer edge part of the turntable 2 from the lower end, and an outer member 71b provided between this inner member 71a and an inner wall surface of the chamber 1. The outer member 71b is provided under the curved part 46 that is formed at the outer edge part of the convex part 4, adjacent to the curved part 46. The inner member 71a surrounds the entire periphery of the heater unit 7, under the outer edge part of the turntable 2 (and under a part slightly on the outer side of the outer edge part of the turntable 2).

As illustrated in FIG. 1, a portion of the bottom part 14 located closer to the rotation center than the space in which the heater unit 7 is provided, forms a protruding part 12a that protrudes upward adjacent to the core part 21 near the central part of the lower surface of the turntable 2. A narrow space is formed between this protruding part 12a and the core part 21. In addition, a narrow gap is formed between the rotational shaft 22 and an inner peripheral surface defining a through-hole in the bottom part 14 penetrated by the rotational shaft 22. These narrow space and gap communicate to the case body 20. A purge gas supply pipe 72 that supplies the $N_2$ gas as a purge gas into the narrow spaces for purging, is provided in the case body 20. Further, a plurality of purge gas supply pipes 73 for purging the space in which the heater unit 7 is provided, are provided in the bottom part 14 of the chamber 1 at predetermined angular intervals along the circumferential direction under the heater unit 7. Only 1 purge gas supply pipe 73 is visible in FIG. 5. In order to reduce the gas entering the region in which the heater unit 7 is provided, a lid member 7a is provided between the heater unit 7 and the turntable 2, to cover between the heater unit 7 and the turntable 2. This lid member 7a extends from an inner peripheral wall of the outer member 71b (upper surface of the inner member 71a) to an upper end part of the protruding part 12a along the circumferential direction. The lid member 7a may be made of quartz, for example.

When the $N_2$ gas is supplied from the purge gas supply pipe 72, this $N_2$ gas flows to the space between the turntable 2 and the lid member 7a, through the gap between the rotational shaft 22 and the inner peripheral surface defining the through-hole in the bottom part 14 penetrated by the rotational shaft 22, and the gap between the protruding part 12a and the core part 21. The $N_2$ gas that flows to the space between the turntable 2 and the lid member 7a is ejected through the first exhaust vent 610 or the second exhaust vent 620 illustrated in FIG. 3. In addition, when the $N_2$ gas is supplied from the purge gas supply pipes 73, this $N_2$ gas flows from the space accommodating the heater unit 7 to a gap (not illustrated) between the lid member 7a and the inner member 71a, and is ejected through the first exhaust vent 610 or the second exhaust vent 620 illustrated in FIG. 3. These flows of the $N_2$ gas can reduce mixture of the gases within the space 481 and the space 382 through the space at the lower central part of the chamber 1 and the space under the turntable 2.

A separation gas supply pipe 51 is connected to a central part of the top plate 11 in the chamber 1, to supply the $N_2$ gas as the separation gas to a space 52 between the top plate 11 and the core part 21. The separation gas supplied to this space 52 is ejected toward the peripheral edge along the upper surface of the turntable 2, including the placing parts where the wafers W are placed, through a narrow space 50 between the projecting part 5 and the turntable 2. The space 50 may be maintained at a pressure higher than the pressures in the space 481 and the space 482. Accordingly, the space 50 reduces the mixture of the first reaction gas supplied to the first process region P1 and the second reaction gas supplied to the second process region P2, through a center region C. In other words, the space 50 (or the center region C) can function similarly to the separation space H (or the separation region D).

Further, as illustrated in FIG. 2 and FIG. 3, the transport port 15 for transporting the wafer W between an external transport arm 10 and the turntable 2 is formed in a sidewall of the chamber 1. This transport port 15 is opened and closed by a gate valve (not illustrated). In addition, the wafer W is transported between the transport arm 10 and the placing part formed by the cavity 24 of the turntable 2 located at an exchange position facing the transport port 15. Hence, the pins (not illustrated) for supporting the lower surface of the wafer W and raising and lowering the wafer W by penetrating the through-holes in the bottom surface of the cavity 24, and an elevator mechanism (not illustrated) for raising and lowering the pins, are provided under the turntable 2 at a position corresponding to the exchange position.

In the film forming apparatus in this embodiment, a control device 100 is provided to control the operation of the entire film forming apparatus. The control device 100 may be formed by a computer including a processor, such as a CPU (Central Processing Unit), and a memory. The memory may store a program which, when executed by the processor, causes the processor to perform steps of a film forming process by the film forming apparatus according to the film forming method described hereinafter. The program may be stored in a medium 102, such as a hard disk, a compact disk, a magneto-optical disk, a memory card, a flexible disk, or the like. The medium 102 may be a non-transitory computer-readable storage medium. A medium reading device (not illustrated) may read the program from the medium 102 and store the program in a storage device 101, to install the program from the storage device 101 into the memory of the control device 100.

As illustrated in FIG. 1, a bellows 16 is provided between the case body 20 and the bottom part 14 of the main enclosure body 12 around the rotational shaft 22. In addition, an elevator mechanism 17, capable of changing a height of the turntable 2 by raising and lowering the turntable 2, is provided on an outer side of the bellows 16. By raising or lowering the turntable 2 by the elevator mechanism 17 and expanding or contracting the bellows 16 according to the raising or lower of the turntable 2, it is possible to change the distance between the high ceiling surface 45 and the wafer W. By providing the bellows 16 and the elevator mechanism 17 with respect to a part of the constituent elements forming the rotational shaft 22 of the turntable 2, it is possible to change the distance between the high ceiling surface 45 and the wafer W while maintaining parallelism of a processing surface (that is, the upper surface) of the wafer W. The configuration of the elevator mechanism 17 is not limited to a particular configuration, as long as the turntable 2 can be raised or lowered by the elevator mechanism 17. As an example, the elevator mechanism 17 may have a configuration that expands or contracts the length of the rotational shaft 22 using gears or the like, for example.

FIG. 6A is a cross sectional view generally illustrating the structure within the vacuum chamber of the film forming apparatus in a state in which the turntable 2 is raised. In the state in which the turntable 2 is raised, the space between the upper surface of the turntable 2 and the low ceiling surface 44 or the projecting part is narrow, and a distance of this space is approximately 3 mm, for example. On the other hand, the space between the lower surface of the turntable 2 and the lid member 7a is wide, and a distance of this space is in a range of 8 mm to 18 mm, and is approximately 13 mm, for example. As will be described later, the film forming process is performed in this state in which the turntable 2 is raised.

FIG. 6B is a cross sectional views generally illustrating the structure within the vacuum chamber of the film forming apparatus in a state in which the turntable 2 is lowered. In the state in which the turntable 2 is lowered, the space between the upper surface of the turntable 2 and the low ceiling surface 44 or the projecting part is wide, and the distance of this space is in a range of 8 mm to 18 mm, and is approximately 13 mm, for example. On the other hand, the space between the lower surface of the turntable 2 and the lid member 7a is narrow, and the distance of this space is approximately 3 mm, for example. According to the film forming method in this embodiment, an anneal process is performed in the state in which the turntable 2 is lowered, at least before or after the film forming process.

In the anneal process described above, the separation gas or the second reaction gas is supplied from the reaction gas nozzle 31 that is an example of a first gas supply part, the separation gas or the second reaction gas is supplied from the reaction gas nozzle 32 that is an example of a second gas supply part, and in a state in which the separation gas is supplied from the separation gas nozzles 41 and 42 that are examples of separation gas supply parts, the turntable 2 is rotated to make at least 1 revolution. In the state in which the turntable 2 is lowered, the wafers W placed in the respective cavities 24 of the turntable 2 are closer to the heater unit 7 than in the state in which the turntable 2 is raised, and thus, a heating effect of the heater unit 7 on the wafers W improves. Accordingly, the temperature of the wafers W can be increased to perform the anneal process, without modifying a set temperature of the heater unit 7. In this state, the distance between the upper surface of the turntable 2 and the low ceiling surface 44 or the projecting part 5 widens, and the gas ejected from the reaction gas nozzle 31 and the gas ejected from the reaction gas nozzle 32 may mix in the space above the wafer W. However, because the separation gas or the second reaction gas is ejected from each of the reaction gas nozzle 31 and the reaction gas nozzle 32, the anneal process can be performed without generating a film forming reaction due to the mixing of the gases.

The anneal process performed before the film forming process is also referred to as a pre-anneal process. The pre-anneal process prevents a situation in which the film cannot be formed uniformly among the plurality of wafers W due to some wafers W being first supplied with the first reaction gas and other wafers W being first supplied with the second reaction gas. In other words, the pre-anneal process is performed to uniformly form the film, such as the oxide film, the nitride film, or the like, on the surface of all of the plurality of wafers W placed on the turntable 2.

In the pre-anneal process, the separation gas or the second reaction gas is supplied from the reaction gas nozzle 31, the separation gas or the second reaction gas is supplied from the reaction gas nozzle 32, and the separation gas is supplied from the separation gas nozzles 41 and 42. For example, the second reaction gas is supplied from the reaction gas nozzles 31 and 32, and the separation gas is supplied from the separation gas nozzles 41 and 42. Alternatively, the separation gas is supplied from the reaction gas nozzle 31 and the separation gas nozzles 41 and 42, and the second reaction gas is supplied from the reaction gas nozzle 32. Or, the separation gas may be supplied from each of the reaction gas nozzles 31 and 32 and the separation gas nozzles 41 and 42.

The anneal process performed after the film forming process is also referred to as a post-anneal process. The post-anneal process prevents a situation in which the film cannot be formed uniformly among the plurality of wafers W due to the film forming process ending immediately after the supply of the first reaction gas for some wafers W and the film forming process ending immediately after the supply of the second reaction gas for other wafers W. In other words, the post-anneal process is performed to uniformly form the film, such as the oxide film, the nitride film, or the like, on the surface of all of the plurality of wafers W placed on the turntable 2. In addition, the post-anneal process is performed to complete an oxidation process when an oxidation gas is used as the second reaction gas and the oxidation reaction is incomplete, and to complete a nitridization process when a nitridization gas is used as the second reaction gas and the nitridization reaction is incomplete.

In the post-anneal process, the separation gas or the second reaction gas is supplied from the reaction gas nozzle 31, the separation gas or the second reaction gas is supplied from the reaction gas nozzle 32, and the separation gas is supplied form the separation gas supply nozzles 41 and 42. For example, the second reaction gas is supplied from the reaction gas nozzles 31 and 32, and the separation gas is supplied from the separation gas nozzles 41 and 42. Alternatively, the separation gas is supplied from the reaction gas nozzle 31 and the separation gas nozzles 41 and 42, and the second reaction gas is supplied from the reaction gas nozzle 32. Or, the separation gas may be supplied from each of the reaction gas nozzles 31 and 32 and the separation gas nozzles 41 and 42.

At least one of the pre-anneal process and the post-anneal process is performed in the state in which the turntable 2 is lowered. However, both the pre-anneal process and the post-anneal process may be performed in the state in which the turntable 2 is lowered. For example, the pre-anneal process may be performed in the state in which the turntable 2 is lowered, and after performing the film forming process in the state in which the turntable 2 is raised, the post-anneal process may be performed in the state in which the turntable 2 is lowered. Of course, it is possible to employ a sequence such that the pre-anneal process is performed in the state in which the turntable 2 is lowered, and the film forming process is thereafter be performed in the state in which the turntable 2 is raised, but the post-anneal process is not performed. In addition, it is possible to employ a sequence such that no pre-anneal process is performed, and after performing the film forming process in the state in which the turntable 2 is raised, the post-anneal process is performed in the state in which the turntable 2 is lowered. Furthermore, in a case in which the pre-anneal process and the post-anneal process are respectively performed before and after the film forming process, one of the pre-anneal process and the post-anneal process may be performed in the state in which the turntable 2 is lowered, and the other of the pre-anneal process and the post-anneal process may be performed in the state in which the turntable 2 is raised.

[Film Forming Method]

Next, the film forming method in this embodiment of the present invention, using the film forming apparatus described above in conjunction with FIG. 1 through FIG. 6B, will be described.

FIG. 7A, FIG. 7B, FIG. 7C, FIG. 7D, and FIG. 7E are cross sectional views of the film forming apparatus for explaining an example of a sequence of the film forming method in one embodiment of the present invention. FIG. 7A through FIG. 7E illustrate, in a simplified manner, the film forming apparatus provided with the turntable 2 and the heater unit 7 inside the chamber 1 having the main enclosure body 12 and the top plate 11. The film forming method in this embodiment will be described for an example of an oxide film forming process that forms a silicon oxide film. Although the diisopropyl aminosilane gas is used as an example of a silicon-containing gas that is used to form the silicon oxide film, the gas is not limited to the diisopropyl aminosilane gas. In addition, although $O_3$ is used as an example of the oxidization gas, the gas is not limited to $O_3$.

Before performing the film forming process illustrated in FIG. 7A through FIG. 7E, the wafers W need to be transported into the chamber 1 and placed on the turntable 2. Hence, the gate valve (not illustrated) is first opened, and the wafer W is transported by the transport arm 10 and placed into the cavity 24 of the turntable 2 through the transport port 15 illustrated in FIG. 3. When 1 cavity 24 stops at the exchange position facing the transport port 15, the pins (not illustrated) penetrating the through-holes in the bottom surface of this cavity 24 are raised and lowered by the elevator mechanism (not illustrated) provided under the turntable 2 at the bottom part 14 of the chamber 1, to receive the wafer W and place the wafer W into this cavity 24. The turntable 2 is rotated intermittently, to successively transport the wafers W into the respective cavities 24 of the turntable 2. In this example, five wafers W are placed in the respective cavities 24 of the turntable 2.

When a substrate treatment is performed in a state in which the inside of the chamber 1 is maintained at a high temperature of 400° C. or higher, the inside of the chamber 1 is maintained at the high temperature even if the heater unit 7 is stopped in order to transport the wafer W into or out of the chamber 1. For this reason, when transporting the wafer W into the chamber 1 and placing the wafer W on the turntable 2, a phenomenon may occur in which the wafer W greatly warps. Hence, when placing the wafer W on the turntable 2, the turntable 2 is lowered as illustrated in FIG. 6B, to maintain a space that provides a sufficiently large distance so that the wafer W does not contact the low ceiling surface 44 even if the wafer W warps. By transporting the wafer W into the chamber 1 and placing the wafer W on the turntable 2 in the state in which the turntable 2 is lowered, it is possible to prevent damage to the wafer W which may otherwise occur when the warped wafer W contacts the ceiling surfaces 44 and 45. In addition, even in a state in which the wafer W placed on the turntable 2 is still warped, the turntable 2 is intermittently rotated to move the wafer W without waiting for the warping to settle, so that the wafers W are successively placed into each of the plurality of cavities 24. In other words, because there is sufficient space between the turntable 2 and each of the ceiling surfaces 44 and 45, after placing the first wafer W into the cavity 24, the next second wafer W can be placed into the next cavity 24 before the warping of the first wafer W settles. For this reason, it is possible to reduce a total time required to place the plurality of wafers W into the respective cavities 24 of the turntable 2, to improve the productivity.

Next, the gate valve is closed, and the vacuum pump 640 evacuates the chamber 1 to a minimum ultimate vacuum. From this state, the film forming process is performed as described hereinafter in conjunction with FIG. 7A through FIG. 7E.

After transporting the wafer W into the film forming apparatus, standby step S01 illustrated in FIG. 7A is performed in a state (DP) in which the turntable 2 is lowered. In the standby step S01, the separation gas nozzles 41 and 42 eject the $N_2$ gas as the separation gas at a predetermined flow rate, and the separation gas supply pipe 51 and the purge gas supply pipes 72 and 72 illustrated in FIG. 1 also eject the $N_2$ gas at a predetermined flow rate. In addition, the reaction gas nozzles 31 and 32 also eject the $N_2$ gas at a predetermined flow rate. In other words, all of the nozzles 31, 32, 41, and 42 eject the $N_2$ gas. Hence, an atmosphere inside the chamber 1 becomes a $N_2$ atmosphere, and the APC 650 adjusts a process pressure inside the chamber 1 to a preset pressure. Next, the wafer W is heated by the heater unit 7, while rotating the turntable 2 clockwise at a predetermined rotational speed. In the state (DP) in which the turntable 2 is lowered, the wafer W placed in the cavity 24 of the turntable 2 is closer to the heater unit 7 compared to a state (UP) in which the turntable 2 is raised, and thus, the temperature of the wafer W can be increased compared to the state (UP) in which the turntable 2 is raised. The temperature of the wafer W when performing the film forming process, which will be described later, in the state (UP) in which the turntable 2 is raised, is set to a predetermined temperature in a range of 50° C. to 780° C., and this predetermined temperature may be approximately 400° C., for example. In a case in which the heater unit 7 is set so that the temperature of the wafer W becomes approximately 400° C. when performing the film forming process in the state (UP) in which the turntable 2 is raised, the temperature of the wafer W is increased to a temperature in a range of approximately 410° C. to approximately 420° C. in the state (DP) in which the turntable 2 is lowered. As a result, preparations for starting the film forming process are made and the film forming apparatus assumes a standby state ready to start the film forming process. The rotational speed of the turntable 2 may be variable in a range of 1 rpm to 240 rpm, for example, according to the usage of the film forming method. In the case of the film forming method in this embodiment, an example will be described in which the rotational speed of the turntable 2 is set to 20 rpm.

In the standby step S01 in this embodiment, the N$_2$ gas is purged not only from the separation gas nozzles 41 and 42 but also from the reaction gas nozzles 31 and 32. However, a noble gas such as an Ar gas, a He gas, or the like may be supplied from the reaction gas nozzles 31 and 32, for example. Similarly, a desired inert gas may be supplied from the separation gas nozzles 41 and 42 according to the usage of the film forming method.

Next, a pre-anneal step S02 is performed in the state (DP) in which the turntable 2 is lowered, as illustrated in FIG. 7B. In the pre-anneal step S02, an anneal process is performed while performing a preflow of an oxidation gas. In the state (DP) in which the turntable 2 is lowered, the temperature of the wafer W is increased to the temperature in a range of approximately 410° C. to approximately 420° C., for example. In the preflow of the oxidation gas, the N$_2$ gas is intermittently supplied from the reaction gas nozzle 31 at the first process region P1 and the separation gas nozzles 41 and 42, but the O$_3$ gas is supplied as the oxidation gas from the reaction gas nozzle 32 at the second process region P2. This state continues until the wafer W undergoes at least 1 revolution. The wafer W is continuously rotating at the predetermined rotational speed from the standby step S01, and in this embodiment, the turntable 2 rotates at 20 rpm. The preflow of the oxidation gas exposes the entire surface of the wafer W to the oxidation gas, and forms a thin oxide film as an underlayer on the wafer W. Accordingly, the O$_3$ gas is supplied to each of the plurality of wafers W to perform an oxidation process, and the states of the plurality of wafers W can be made approximately the same. The wafer W is rotated to undergo at least 1 revolution, because the O$_3$ gas is supplied only from the reaction gas nozzle 32, and in order to supply the O$_3$ gas to the surface of each of the plurality of wafers W regardless of the position when starting the supply of the O$_3$ gas, each of the plurality of wafers W needs to undergo at least 1 revolution to pass under the reaction gas nozzle 32. According to the film forming method in this embodiment, the turntable 2 is rotated a the rotational speed of 20 rpm, and the O$_3$ gas is supplied for 3 seconds in the preflow of the oxidation gas in the pre-anneal step S02. Hence, in the pre-anneal step S02 of the film forming method in this embodiment, the preflow of the oxidation gas rotates the turntable 2 by an amount represented by 20 (rpm)/60 (sec)×3 (sec)=1 (revolution).

Unless the process limits the oxidation to a minimum, the O$_3$ gas may be supplied while the wafer W undergoes 2 or more revolutions. Hence, the wafer W may be rotated to undergo more than 1 revolution in the state in which the O$_3$ gas is supplied. For example, in the preflow of the oxidation gas in the pre-anneal step S02, the wafer W may be rotated to undergo 2 or 3 revolutions, or undergo an odd number of revolutions including fractions, such as 1.5 revolutions, for example.

Next, as illustrated in FIG. 7C, a film forming step S03 to form a silicon oxide film is performed in the state (UP) in which the turntable 2 is raised by the elevator mechanism 17. In the state (UP) in which the turntable 2 is raised, the temperature of the wafer W becomes 400° C., for example. In the film forming step S03 to form the silicon oxide film, the reaction gas nozzle 31 supplies the diisopropyl aminosilane gas, and the reaction gas nozzle 32 supplies the O$_3$ gas, with respect to the wafer W. In other words, in the film forming step S03 to form the silicon oxide film, the diisopropyl aminosilane gas and the O$_3$ gas are supplied simultaneously. However, the diisopropyl aminosilane gas and the O$_3$ gas are separated by the separation region D, and these 2 gases hardly ever mix inside the chamber 1.

When supplying the diisopropyl aminosilane gas and the O$_3$ gas simultaneously, the diisopropyl aminosilane gas is adsorbed on the surface of the thin oxide film that is formed on the wafer W in the pre-anneal step S02, as the turntable 2 rotates and the wafer W passes the first process region P1. Next, when the wafer W passes the second process region P2, the diisopropyl aminosilane gas adsorbed on the surface of the wafer W is oxidized by the O$_3$ gas, to form a silicon oxide film (a molecular film of silicon oxide) on the surface of the wafer W. Thereafter, the turntable 2 is rotated to undergo a predetermined number of revolutions until the silicon oxide film having a desired thickness is formed on the wafer W. The film forming step S03 to form the silicon oxide film ends when the supply of the diisopropyl aminosilane gas and the O$_3$ gas is stopped.

The film forming step S03 is performed to form the silicon oxide film by supplying the O$_3$ gas in succession to the preflow of the oxidation gas in the pre-anneal step S02, and supplying the diisopropyl aminosilane gas. The rotational speed of the turntable 2 is maintained at 20 rpm, and a film forming cycle in which the turntable 2 undergoes 1 revolution in 3 seconds is repeated n times if necessary. The predetermined number n of revolutions of the turntable 2 may be determined according to a thickness of the silicon oxide film that is formed in the film forming step S03, and the predetermined number n of revolutions of the turntable 2 may be set in a range of 1 to 50, or may be set in a range of 1 to 30, for example.

Next, as illustrated in FIG. 7D, post-anneal step S04 is performed in the state (DP) in which the turntable 2 is lowered by the elevator mechanism 17. In the post-anneal step S04, an anneal process is performed while performing a postflow of the oxidation gas. In the state (DP) in which the turntable 2 is lowered, the temperature of the wafer W is increased to the temperature in the range of approximately 410° C. to approximately 420° C., for example. In the postflow of the oxidation gas, the N$_2$ gas is supplied from the reaction gas nozzle 31 provided at the first process region P1 and the separation gas nozzles 41 and 42 provided at the separation region D, and the O$_3$ gas is supplied from the reaction gas nozzle 32 provided at the second process region P2. In this state, the turntable 2 is rotated to undergo at least 1 revolution, and all of the plurality of wafers W placed on the turntable 2 are exposed to the O$_3$ gas. Hence, even in the case of the wafer W with respect to which the film forming step S03 to form the silicon oxide film ended at a point when the wafer W passes the second process region P2, this wafer W always passes through the second process region P2 in the post-anneal step S04, and the film forming process can be ended in a state in which the oxidation process has been performed.

In the postflow of the oxidation gas in the post-anneal step S04 of the film forming method in this embodiment, the turntable 2 is rotated for 3 seconds in a state in which the rotational speed of the turntable 2 is maintained at 20 rpm, and similarly as in the case of the preflow of the oxidation gas in the pre-anneal step S02, the turntable 2 is rotated to undergo 1 revolution. Accordingly, the turntable 2 may be rotated to undergo the same number of revolutions when performing the pre-anneal step S02 and the when performing the post-anneal step S04.

Next, as illustrated in FIG. 7E, standby step S05 is performed in the state (DP) in which the turntable 2 is lowered. In the state (DP) in which the turntable 2 is lowered, the temperature of the wafer W is increased to the temperature in the range of approximately 410° C. to approximately 420° C., for example. In the standby step S05, the $N_2$ gas is supplied from the reaction gas nozzles 31 and 32 and the separation gas nozzles 41 and 42, that is, from all of the nozzles 31, 32, 41, and 42, and the inside of the chamber 1 is filled by the $N_2$ gas. Further, after the standby step S05 continues for a predetermined time, the supply of the $N_2$ gas to the chamber 1 is stopped, and the rotation of the turntable 2 is stopped. Thereafter, the wafer W is transported outside the chamber 1 by a procedure performed in reverse order to the procedure to transport the wafer W into the chamber 1. As a result, the film forming process to form the silicon oxide film ends.

According to the film forming method in this embodiment, the pre-anneal step S02 (or preflow of the oxidation gas) is performed before the film forming step S03 to form the silicon oxide film, and the post-anneal step S04 (or postflow of the oxidation gas) is performed after the film forming step S03 to form the silicon oxide film, to provide step of supplying only the $O_3$ gas. Hence, among the plurality of wafers W arranged along the circumferential direction on the turntable 2, no wafer W is supplied with the diisopropyl aminosilane gas without being exposed to the $O_3$ gas, to thereby enable a uniform film forming process among the plurality of wafers W.

As an example, the film forming method in this embodiment sets the rotational speed of the turntable 2 to 20 rpm, and the number of revolutions of the turntable 2 is set to 1 for each of the pre-anneal step S02 and the post-anneal step S04. However, these settings may be modified according to the usage of the film forming method, as long as the number of revolutions of the turntable 2 is 1 or more for each of the pre-anneal step S02 and the post-anneal step S04.

In the described example of the film forming method in this embodiment, the $O_3$ gas is used as an example of the oxidation gas. However, various kinds of oxidation gases may be used, including water ($H_2O$), oxygen, radical oxygen, or the like, for example.

In addition, although the described example of the film forming method in this embodiment performs the film forming process to form the silicon oxide film, the first reaction gas may be modified according to the desired oxide film that is to be formed. For example, the first reaction gas may be modified to a gas including a metal element such as hafnium, zirconium, aluminum, titanium, strontium, or the like, and an oxidation gas such as an ozone gas may be used as the second reaction gas, to form an oxide film of the metal such as hafnium, zirconium, aluminum, titanium, strontium, or the like by performing a process similar to that of the film forming method described above.

Moreover, a desired film may be formed by modifying the kind of the second reaction gas according to the usage of the film forming method. For example, a gas including silicon, such as the diisopropyl aminosilane gas, may be used as the first reaction gas, and the second reaction gas may be modified to a nitride gas such as an ammonia gas or the like. A silicon nitride film can be formed by performing steps similar to those of the film forming method described above.

The kinds of the first reaction gas and the second reaction gas may be modified according to the desired film to be formed according to the usage of the film forming method. For example, the first reaction gas may be modified to a gas including the metal element such as hafnium, zirconium, aluminum, titanium, strontium, or the like, and the second reaction gas may be modified to a nitride gas such as an ammonia gas or the like. In this case, it is possible to form the nitride film of the metal such as hafnium, zirconium, aluminum, titanium, strontium, or the like by performing a process similar to that of the film forming method described above.

In the described example of the film forming method in this embodiment, the pre-anneal step S02 and the post-anneal step S04 are performed using the same rotational speed and the same number of revolutions of the turntable 2, that is, requiring the same process time. However, the process time of the post-anneal step S04 may be set longer than the process time of the pre-anneal step S02, for example. Among the various kinds of firm forming processes described above, the supply of the oxidation gas in the post-anneal step S04 may be performed not only for the purposes of uniformly forming the films among the plurality of wafers W, but also for the purposes of improving a film quality of the film after formation. In other words, after forming a predetermined oxide film, it may be desirable to improve the film quality of the predetermined oxide film after formation, by further supplying the oxidization gas to the predetermined oxide film to sufficiently perform the oxidization. In such a case, a sufficiently long time may be allocated to the postflow of the oxidation gas in the post-anneal step S04, so that the film forming process also serves as a film quality improving process. For example, when forming the silicon oxide film in the example of the film forming process described above, the rotational speed of the turntable 2 may be set to 20 rpm, the pre-anneal step S02 may be performed for 36 seconds by rotating the turntable 2 to undergo 12 revolutions, and the post-anneal step S04 may be performed for 180 seconds by rotating the turntable 2 to undergo 60 revolutions. In the case of the silicon oxide film, the oxygen preferably reaches the silicon within the silicon oxide film in order to generate a sufficient reaction, and thus, the film quality of the silicon oxide film can be improved by allocating a sufficiently long time for the postflow of the oxidization gas in the post-anneal step S04.

Accordingly, the number of revolutions of the wafer W, that is, the process time for the same rotational speed of the turntable 2, need not be the same for the pre-anneal step S02 and the post-anneal step S04, and the number of revolutions of the wafer W or the process time may be set appropriately according to the usage of the film forming method. In addition, in the post-anneal step S04, the number of revolutions of the turntable or the process time may be set not only to uniformly supply the oxidization gas in order to uniformly form the oxide films on the wafers W, but also to improve the film quality of the oxide film that is formed.

According to the film forming method in this embodiment, it is possible to uniformly form the oxide film or the nitride film on the plurality of wafers W by performing the pre-anneal step S02 and the post-anneal step S04. The temperature of the wafer W can be changed by raising and lowering the turntable 2 by the elevator mechanism 17, without modifying the set temperature of the heater unit 7. The productivity can be improved by using the same film forming apparatus, that is used for the film forming step (in-situ), when performing the pre-anneal step and the post-anneal step, to shorten the time required for the temperature of the wafer (substrate) W to reach the target temperature.

[Film Forming Method of Comparison Example]

Next, a film forming method of a comparison example will be described, by referring to FIG. 8A, FIG. 8B, FIG. 8C, FIG. 8D, and FIG. 8E. FIG. 8A, FIG. 8B, FIG. 8C, FIG. 8D, and FIG. 8E are cross sectional views of the film forming apparatus for explaining a sequence of the film forming method in the comparison example. FIG. 8A through FIG.

8E illustrate, in a simplified manner, the film forming apparatus provided with the turntable 2 and the heater unit 7 inside the chamber 1 having the main enclosure body 12 and the top plate 11, similarly to FIG. 7A, FIG. 7B, FIG. 7C, FIG. 7D, and FIG. 7E, respectively. The film forming method in this comparison example will be described for an example of an oxide film forming process that forms a silicon oxide film, similarly to the film forming method in the embodiment described above.

Before performing the film forming process illustrated in FIG. 8A through FIG. 8E, the wafers W are transported into the chamber 1 and placed on the turntable 2. Then, the gate valve (not illustrated) is closed, and a vacuum pump 640 evacuates the chamber 1 to a minimum ultimate vacuum. From this state, the film forming process is performed as described hereinafter in conjunction with FIG. 8A through FIG. 8E.

After transporting the wafer W into the film forming apparatus, standby step S11 illustrated in FIG. 8A is performed in a state (DP) in which the turntable 2 is lowered. In the standby step S11, the separation gas nozzles 41 and 42 eject the $N_2$ gas as the separation gas at a predetermined flow rate, and the separation gas supply pipe 51 and the purge gas supply pipes 72 and 72 illustrated in FIG. 1 also eject the $N_2$ gas at a predetermined flow rate. In addition, the reaction gas nozzles 31 and 32 also eject the $N_2$ gas at a predetermined flow rate. Next, the wafer W is heated by the heater unit 7, while rotating the turntable 2 clockwise at a predetermined rotational speed. The heater unit 7 is set so that the temperature of the wafer W becomes approximately 400° C., for example, when performing the film forming process in a state (UP) in which the turntable 2 is raised. As a result, preparations for starting the film forming process are made and the film forming apparatus assumes a standby state ready to start the film forming process.

Next, a pre-anneal step S12 is performed in the state (UP) in which the turntable 2 is raised by the elevator mechanism 17, as illustrated in FIG. 8B. In the pre-anneal step S12, an anneal process is performed while performing a preflow of an oxidation gas. In the state (UP) in which the turntable 2 is raised, the temperature of the wafer W is 400° C., for example. In the preflow of the oxidation gas, the $N_2$ gas is intermittently supplied from the reaction gas nozzle 31 at the first process region P1 and the separation gas nozzles 41 and 42, but the $O_3$ gas is supplied as the oxidation gas from the reaction gas nozzle 32 at the second process region P2. This state continues until the wafer W undergoes at least 1 revolution.

Next, as illustrated in FIG. 8C, a film forming step S13 to form a silicon oxide film is performed in the state (UP) in which the turntable 2 is raised. In the state (UP) in which the turntable 2 is raised, the temperature of the wafer W is 400° C., for example. In the film forming step S13 to form the silicon oxide film, the reaction gas nozzle 31 supplies the diisopropyl aminosilane gas, and the reaction gas nozzle 32 supplies the $O_3$ gas, with respect to the wafer W.

When supplying the diisopropyl aminosilane gas and the $O_3$ gas simultaneously, the diisopropyl aminosilane gas is adsorbed on the surface of the wafer W, as the turntable 2 rotates and the wafer W passes the first process region P1. Next, when the wafer W passes the second process region P2, the diisopropyl aminosilane gas adsorbed on the surface of the wafer W is oxidized by the $O_3$ gas, to form a silicon oxide film (a molecular film of silicon oxide) on the surface of the wafer W. Thereafter, the turntable 2 is rotated to undergo a predetermined number of revolutions until the silicon oxide film having a desired thickness is formed on the wafer W. The film forming step S13 to form the silicon oxide film ends when the supply of the diisopropyl aminosilane gas and the $O_3$ gas is stopped.

Next, as illustrated in FIG. 8D, post-anneal step S14 is performed in the state (UP) in which the turntable 2 is raised. In the post-anneal step S14, an anneal process is performed while performing a postflow of the oxidation gas. In the state (UP) in which the turntable 2 is raised, the temperature of the wafer W is approximately 400° C., for example. In the postflow of the oxidation gas, the $N_2$ gas is supplied from the reaction gas nozzle 31 provided at the first process region P1 and the separation gas nozzles 41 and 42 provided at the separation region D, and the $O_3$ gas is supplied from the reaction gas nozzle 32 provided at the second process region P2.

Next, as illustrated in FIG. 8E, standby step S15 is performed in the state (DP) in which the turntable 2 is lowered by the elevator mechanism 17. In the standby step S15, the $N_2$ gas is supplied from the reaction gas nozzles 31 and 32 and the separation gas nozzles 41 and 42, that is, from all of the nozzles 31, 32, 41, and 42, and the inside of the chamber 1 is filled by the $N_2$ gas. Further, after the standby step S15 continues for a predetermined time, the supply of the $N_2$ gas to the chamber 1 is stopped, and the rotation of the turntable 2 is stopped. Thereafter, the wafer W is transported outside the chamber 1 by a procedure performed in reverse order to the procedure to transport the wafer W into the chamber 1. As a result, the film forming process to form the silicon oxide film ends.

According to the film forming method in this comparison example, in a case in which the temperature of the wafer W during the pre-anneal step S12 and the post-anneal step S14 is to be set to a temperature that is different from the temperature of the wafer W during the film forming step S13, it is necessary to modify the set temperature of the heater unit 7. In this case, the productivity is poor because it takes time for the temperature of the wafer W to reach the target temperature.

EXEMPLARY IMPLEMENTATION

Figure 9:
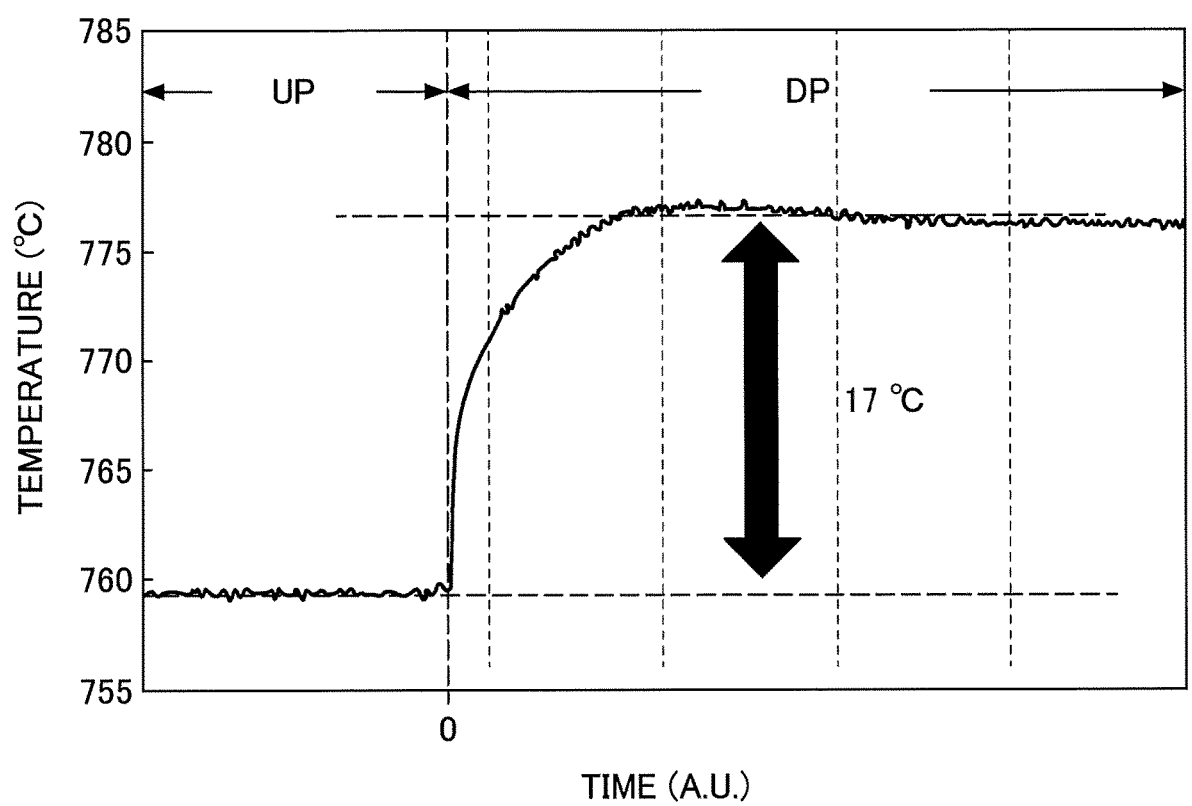
FIG. 9 is a diagram illustrating a change in a wafer temperature when a turntable is moved from a raised state to a lowered state in an exemplary implementation of the present invention.

FIG. 9 is a diagram illustrating a change in a wafer temperature when a turntable is moved from the raised state (UP) to the lowered state (DP) in an exemplary implementation of the present invention. In FIG. 9, the ordinate indicates the wafer temperature, and the abscissa indicates the time in A. U. (Arbitrary Units). It was confirmed that, when the turntable 2 is lowered from the state (UP) in which the turntable 2 is raised when the temperature of the wafer W is approximately 760° C., the temperature of the wafer W can be increased by approximately 17° C. In other words, it was confirmed that the temperature of the wafer W can be changed by raising and lowering the turntable 2 by the elevator mechanism 17, without modifying the set temperature of the heater unit 7. Further, it was confirmed that the productivity can be improved by using the same film forming apparatus, that is used for the film forming step (in-situ), when performing the pre-anneal step and the post-anneal step, to shorten the time required for the temperature of the wafer (substrate) W to reach the target temperature.

In the embodiment described above, the kind of the first reaction gas may be modified according to the usage of the film forming method, so as to form a desired oxide film. For example, a metal oxide film or a metal nitride film can be formed by modifying the first reaction gas and the second reaction gas. A hafnium oxide (HfO) film can be formed using a Hf-containing gas as the first reaction gas, and using the ozone gas as the second reaction gas, for example. In addition, a titanium nitride (TiN) film can be formed using a Ti-containing gas as the first reaction gas, and using the ammonia gas as the second reaction gas, for example.

According to the embodiment and exemplary implementation described above, it is possible to provide a film forming method that performs a pre-anneal process and a post-anneal process using the same film forming apparatus that is used to perform a film forming process (that is, using an in-situ process), to reduce a time it takes for a wafer (or substrate) temperature to reach a target temperature and to improve the productivity.

Further, the present invention is not limited to these embodiments, but various variations, modifications, and substitutions may be made without departing from the scope of the present invention.

What is claimed is:

1. A film forming method that forms a film including a predetermined element on a plurality of substrates using a film forming apparatus including
   a turntable rotatably provided within a chamber and including an upper surface with a plurality of placing parts on which the plurality of substrates are placed,
   a heater unit provided under the turntable,
   a first process region sectioning a region above the upper surface of the turntable and including a first gas supply part configured to supply a gas towards the upper surface of the turntable,
   a second process region arranged at a position separated from the first process region along a circumferential direction of the turntable, and configured to supply a gas towards the upper surface of the turntable,
   a separation gas supply part provided between the first process region and the second process region, and configured to supply a separation gas toward the upper surface of the turntable, and
   a separation region including a ceiling surface that forms spaces with respect to the upper surface of the turntable to guide the separation gas from the separation gas supply part toward the upper surface of the turntable,
   the film forming method comprising:
      performing a film forming process to form the film including the predetermined element on the plurality of substrates, by supplying a first reaction gas including the predetermined element from the first gas supply part and supplying a second reaction gas from the second gas supply part in a raised state of the turntable, and rotating the turntable to undergo a predetermined number of revolutions in a state in which the separation gas is supplied from the separation gas supply part;
      performing an anneal process at least before or after the film forming process, by supplying the separation gas or the second reaction gas from the first gas supply part and supplying the separation gas or the second reaction gas from the second gas supply part in a lowered state of the turntable, and rotating the turntable to undergo at least one revolution in a state in which the separation gas is supplied from the separation gas supply part; and
   setting a temperature of the heater unit that is turned on, wherein the plurality of substrates are closer to the heater unit in the lowered state of the turntable than in the raised state of the turntable, and
   wherein the turntable is raised to the raised position and lowered to the lowered position without modifying the set temperature of the heater unit that is turned on.

2. The film forming method as claimed in claim 1, wherein the anneal process includes a pre-anneal process performed before the film forming process.

3. The film forming method as claimed in claim 2, wherein the pre-anneal process includes supplying the separation gas or the second reaction gas from the first gas supply part, and supplying the second reaction gas from the second vas supply part.

4. The film forming method as claimed in claim 1, wherein the anneal process includes a post anneal process performed after the film forming process.

5. The film forming method as claimed in claim 4, wherein the post-anneal process includes supplying the separation gas or the second reaction gas from the first gas supply pan, and supplying the second reaction gas from the second gas supply part.

6. The film forming method as claimed in claim 1, wherein the anneal process includes a pre-anneal process performed before the film forming process, and a post-anneal process performed after the film forming process.

7. The film forming method as claimed in claim 6, wherein
   the pre-anneal process includes supplying the separation gas or the second reaction gas from the first gas supply part, and supplying the second reaction gas from the second gas supply part, and
   the post-anneal process includes supplying the separation gas or the second reaction gas from the first gas supply part, and supplying the second reaction gas from the second gas supply part.

8. The film forming method as claimed in claim 6, wherein the post-anneal process is performed for a time longer than the pre-anneal process.

9. The film forming method as claimed in claim 1, wherein the second reaction gas is a nitridization gas.

10. The film forming method as claimed in claim 9, wherein the nitridization gas is an ammonia gas.

11. The film forming method as claimed in claim 1, wherein the second reaction gas is an oxidation gas.

12. The film forming method as claimed in claim 11, wherein the oxidation gas is an ozone gas.

13. The film forming method as claimed in claim 1, wherein the predetermined element is a metal element or a semiconductor element.

14. The film forming method as claimed in claim 13, wherein
   the metal element is selected from a group consisting of hafnium, zirconium, aluminum, titanium, and strontium, and
   the semiconductor element is silicon.

15. The film forming method as claimed in claim 1, wherein the separation gas is an inert gas.

16. The film forming method as claimed in claim 1, further comprising:
   transporting the plurality of substrates into the chamber, onto the turntable within the chamber before a pre-anneal process, in a case in which the anneal process includes the pre-anneal process performed before the film forming process.

17. The film forming method as claimed in claim 1, further comprising:
   transporting the plurality of substrates out of the chamber, from the turntable within the chamber after a post-anneal process, in a case in which the anneal process includes the post-anneal process performed after the film forming process.

18. The film forming method as claimed in claim 1, wherein
- the film forming process and the anneal process are performed in a state where the heater unit is turned on,
- the plurality of substrates are heated to a first temperature in the raised state of the turntable, and
- the plurality of substrates are heated to a second temperature higher than the first temperature in the lowered state of the turntable.

* * * * *